United States Patent
Kandukuri et al.

(10) Patent No.: US 11,750,196 B1
(45) Date of Patent: Sep. 5, 2023

(54) DDR PHY FLOORPLAN

(71) Applicant: QUALCOMM Incorporated, San Diego, CA (US)

(72) Inventors: Praveen Kumar Kandukuri, Bangalore (IN); Pavan Vithal Torvi, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/664,567

(22) Filed: May 23, 2022

(51) Int. Cl.
  *H03K 19/17736* (2020.01)
  *H03K 19/1776* (2020.01)

(52) U.S. Cl.
  CPC ..... *H03K 19/1776* (2013.01); *H03K 19/1774* (2013.01); *H03K 19/17744* (2013.01)

(58) Field of Classification Search
  None
  See application file for complete search history.

(56) References Cited

U.S. PATENT DOCUMENTS

| | | | |
|---|---|---|---|
| 7,859,304 B1* | 12/2010 | Pan ................... | H03K 19/17744 326/47 |
| 9,032,358 B2 | 5/2015 | Srinivas et al. | |
| 2011/0299351 A1* | 12/2011 | Schultz ............ | H03K 19/17744 365/219 |
| 2019/0205144 A1* | 7/2019 | Zhang .................. | G06F 3/0611 |

* cited by examiner

*Primary Examiner* — Anh Q Tran
(74) *Attorney, Agent, or Firm* — Procopio, Cory, Hargreaves & Savitch LLP

(57) ABSTRACT

An IC includes a first set of core logic configured to convert data between a single stream and a double stream, and a first data I/O block on a first side of the first set of core logic. The first data I/O block interfaces with the first set of core logic and a DRAM. The IC further includes a second set of core logic configured to process CA information, and a first CA I/O subblock on a second side of the first set of core logic. The first CA I/O subblock interfaces with the second set of core logic and the DRAM. The IC further includes a first set of power switches adjacent at least one side of the first CA I/O subblock. The first set of power switches is coupled to the first set of core logic and the second set of core logic.

12 Claims, 3 Drawing Sheets

DDR PHY FLOORPLAN

TECHNICAL FIELD

The present disclosure relates generally to a layout structure, and more particularly, to a double data rate (DDR) physical (PHY) floorplan.

INTRODUCTION

A double data rate (DDR) physical (PHY) provides an interface between a memory controller and a dynamic random-access memory (DRAM). There is currently a need to reduce power consumption, increase performance, and reduce a footprint area for DDR PHYs.

BRIEF SUMMARY

In an aspect of the disclosure, an integrated circuit (IC) includes a first set of core logic configured to convert data between a single stream and a double stream. The IC further includes a first data input or output (I/O) block on a first side of the first set of core logic. The first data I/O block interfaces with the first set of core logic. The first data I/O block includes a plurality of I/O circuits for interfacing with a DRAM. The first data I/O block is in one column. The IC further includes a second set of core logic configured to process command and address (CA) information. The IC further includes a first CA I/O subblock on a second side of the first set of core logic. The first CA I/O subblock interfaces with the second set of core logic. The first CA I/O subblock includes a plurality of I/O circuits for interfacing with the DRAM. The IC further includes a first set of power switches adjacent at least one side of the first CA I/O subblock. The first set of power switches is coupled to the first set of core logic and the second set of core logic.

In one configuration, the IC further includes a third set of core logic configured to convert data between a single stream and a double stream. In the configuration, the IC further includes a second data I/O block on a first side of the third set of core logic. The second data I/O block interfaces with the third set of core logic. The second data I/O block includes a plurality of I/O circuits for interfacing with the DRAM. The second data I/O block is in one column. In the configuration, the IC further includes a second CA I/O subblock on a second side of the third set of core logic. The second CA I/O subblock interfaces with the second set of core logic. The second CA I/O subblock includes a plurality of I/O circuits for interfacing with the DRAM. The first CA I/O subblock and the second CA I/O subblock together are a folded double-column I/O block. In the configuration, the IC further includes a second set of power switches adjacent at least one side of the second CA I/O subblock. The second set of power switches is coupled to the third set of core logic and the second set of core logic.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
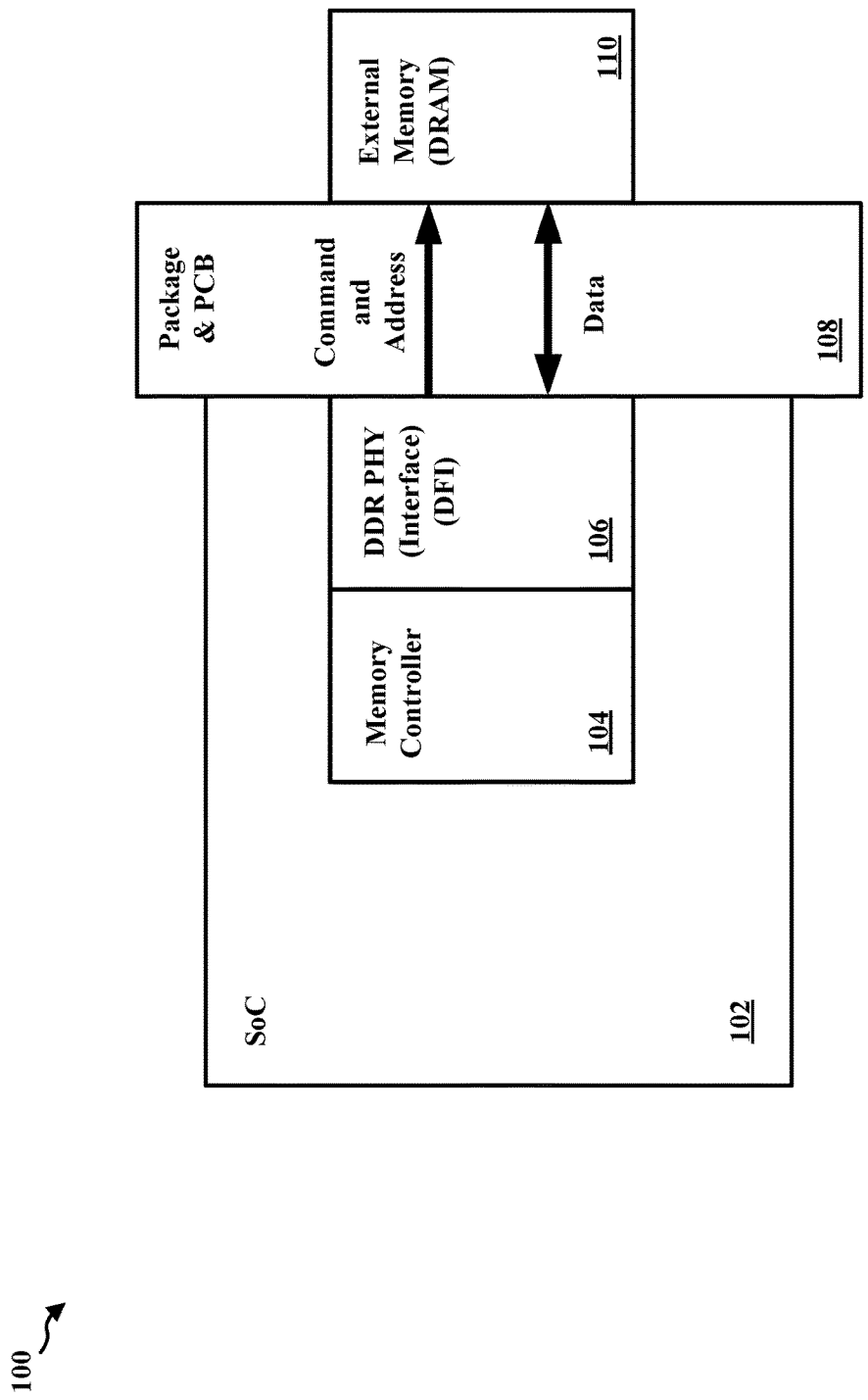
FIG. 1 is a diagram illustrating a DDR PHY interfacing between a memory controller and a DRAM.

FIG. 1 is a diagram 100 illustrating a DDR PHY 106 (also referred to as a DDR PHY block or DDR PHY macro) interfacing between a memory controller 104 and an external memory device 110. As illustrated in FIG. 1, a system on a chip (SoC) 102 includes a memory controller 104 and a DDR PHY 106, packaged together on a printed circuit board (PCB). The DDR PHY 106 may also be referred to as a DDR PHY interface (DFI). The DDR PHY 106 connects the memory controller 104 and the external memory device 110 (e.g., DRAM). The DDR PHY 106 is a high speed critical data interface. The DDR PHY 106 communicates data and command and address (CA) information across the package and PCB 108 based on a DRAM data transfer protocol with the external memory device 110. The DDR PHY 106 provides several functions, one of which is to convert a single data rate to a double data rate.

In advanced technology nodes, data transfer rates have increased up to 6400 Mbps. To meet such high-speed data rates with an arbitrary floorplan is extremely difficult. Parameters such as clock jitter, clock latency, critical instance current (I)*resistance (R) drop (i.e., also referred to as voltage drop or IR drop), and decoupling capacitance requirements are important for DDR PHY operation, and any floorplan should optimize these metrics. If the above mentioned metrics are not met, then the DDR PHY would not function as expected, and major floorplan changes would be necessary to meet the metrics. If non-conformance to any of the specifications is discovered towards an end of a project, project delivery expectations may not be satisfied. Accordingly, significant effort is normally spent in evaluating a DDR PHY floorplan and ensuring that the floorplan meets all requirements. Once a floorplan is chosen, the floorplan is typically carrier forward for similar generation PHY implementations.

Key parameters that should be met to enable high-speed data transfer include clock jitter, wire-length route, power gating switches, decoupling capacitance, clock latency/insertion, and spatial variability. A higher clock jitter leads to challenges in meeting timing requirements for high-speed logic. A longer wire-length route from the input/output (JO) pad can result in signal integrity challenges. With power gating switches, it can be difficult to meet tight IR drop requirements for high-speed critical logic. Decoupling capacitance requirements may be a function of operating speed. A higher speed of operation needs a higher decoupling capacitance and vice-versa. Decoupling capacitances may have limitations in available placement near a sink that has a significant toggle. Jitter and power are directly proportional to the clock latency. With increasing die size, the clock latency (i.e., the total clock traversal time from the phase-locked loop (PLL) to core logic) may increase. As higher latency adversely impacts jitter and power, minimizing latency in a floorplan is important. For better delay matching across all data bits, spatial variability due to custom analog circuits should be minimal. Within a smaller area, custom analog circuits may be placed within a short distance in order to reduce spatial variability across different data bits and clock. Meeting the above critical metrics with an arbitrary floorplan is difficult. As such, to meet the above critical metrics, a specific placement of analog macros, IO pads, and critical logic may be requirement. Such a floorplan that provides for meeting the above critical metrics is provided below with respect to FIGS. 2, 3.

Figure 2:
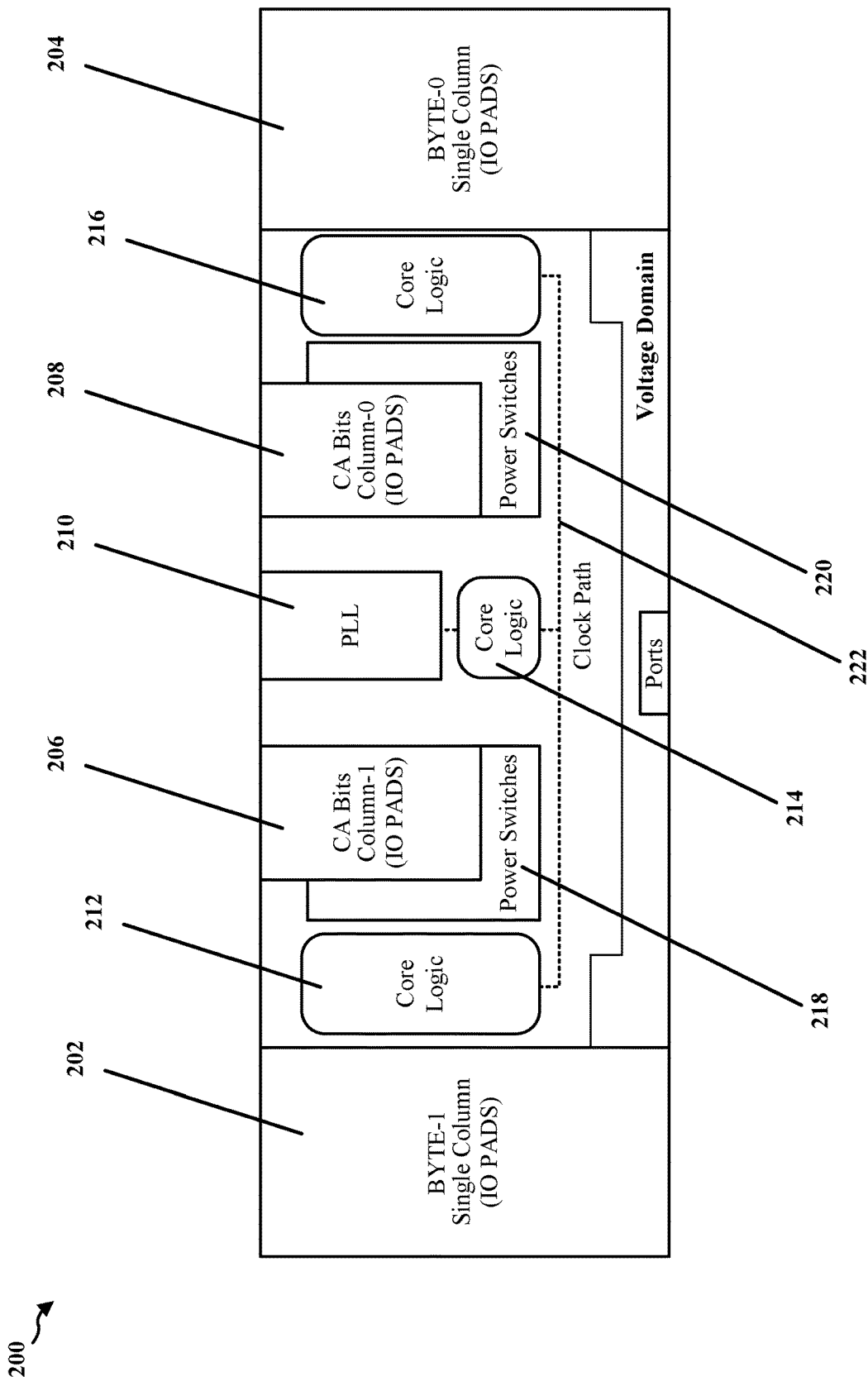
FIG. 2 is a diagram illustrating a first configuration of a DDR PHY floorplan.

FIG. 2 is a diagram 200 illustrating a first configuration of a DDR PHY floorplan. As illustrated in FIG. 2, a DDR PHY includes a first set of core logic 212 (also referred to as "critical logic") configured to convert data between a single stream and a double stream. Specifically, the first set of core logic 212 is configured to convert data for writing from a single data rate to a double data rate, and for reading from a double data rate to a single data rate. The DDR PHY further includes a first data I/O block 202 on a first side of the first set of core logic 212. In one example, the first data I/O block 202 provides 8 data read/write bits (i.e., one byte) and one data mask (DM) bit. The first data I/O block 202 interfaces with the first set of core logic 212. The first data I/O block 202 includes a plurality of I/O circuits for interfacing with an external memory/DRAM 110. The first data I/O block 202 is in one column (or a single row) rather than in multiple columns (rows), such as in a "butterfly" or "folded" configuration. As such, columns 0, 1 of a "butterfly"/"folded" configuration interface block are combined into one column for the first data I/O block 202. The DDR PHY further includes a second set of core logic 214 configured to process CA information. The DDR PHY further includes a first CA I/O subblock 206 on a second side of the first set of core logic 212. In one example, the first CA I/O subblock 206 provides 3 CA bits and 1 clock enable bit. The first CA I/O subblock 206 interfaces with the second set of core logic 214. The first CA I/O subblock 206 includes a plurality of I/O circuits for interfacing with the external memory/DRAM 110. The DDR PHY further includes a first set of power switches 218 adjacent at least one side of the first CA I/O subblock 206. The first set of power switches 218 is coupled to the first set of core logic 212 and the second set of core logic 214. The first set of power switches 218 gates power to the first set of core logic 212 and the second set of core logic 214 so that when the DDR PHY is not in operation, power can be conserved.

As illustrated in FIG. 2, the first set of power switches 218 is immediately adjacent the at least one side of the first CA I/O subblock 206. In one configuration, the first set of power switches 218 is adjacent two sides of the first CA I/O subblock 206, and at least a portion of the first set of power switches 218 is between the first CA I/O subblock 206 and the first set of core logic 212.

As illustrated in FIG. 2, the DDR PHY further includes a third set of core logic 216 configured to convert data between a single stream and a double stream. Specifically, the third set of core logic 216 is configured to convert data for writing from a single data rate to a double data rate, and for reading from a double data rate to a single data rate. The DDR PHY further includes a second data I/O block 204 on a first side of the third set of core logic 216. In one example, the second data I/O block 204 provides 8 data read/write bits (i.e., one byte) and one DM bit. The second data I/O block 204 interfaces with the third set of core logic 216. The second data I/O block 204 includes a plurality of I/O circuits for interfacing with the external memory/DRAM 110. The second data I/O block 204 is in one column with a similar configuration as the first data I/O block 202. The DDR PHY further includes a second CA I/O subblock 208 on a second side of the third set of core logic 216. In one example, the second CA I/O subblock 208 provides 3 CA bits, 1 clock bit, and 1 inverted clock bit. The second CA I/O subblock 208 interfaces with the second set of core logic 214. The second CA I/O subblock 208 includes a plurality of I/O circuits for interfacing with the external memory/DRAM 110. The first CA I/O subblock 206 and the second CA I/O subblock 208 together are a folded double-column I/O block in a "butterfly" configuration. The DDR PHY further includes a second set of power switches 220 adjacent at least one side of the second CA I/O subblock 208. The second set of power switches 220 is coupled to the third set of core logic 216 and the second set of core logic 214. The second set of power switches 220 gates power to the third set of core logic 216 and the second set of core logic 214 so that when the DDR PHY is not in operation, power can be conserved.

As illustrated in FIG. 2, the second set of power switches 220 is immediately adjacent the at least one side of the second CA I/O subblock 208. In one configuration, the second set of power switches 220 is adjacent two sides of the second CA I/O subblock 208, and at least a portion of the second set of power switches 220 is between the second CA I/O subblock 208 and the third set of core logic 216.

The DDR PHY may further include a PLL 210 on a first side of the second set of core logic 214 and between the first CA I/O subblock 206 and the second CA I/O subblock 208. The PLL is configured to provide a clock signal through a clock path 222 to the first set of core logic 212, the second set of core logic 214, and the third set of core logic 216. As can be seen in FIG. 2, the first set of core logic 212 and the third set of core logic 216 are approximately equidistant from the PLL. Consequently, a clock path length of the clock path 222 for carrying the clock signal between the PLL 210 and the first set of core logic 212 is approximately equal to a clock path length for carrying the clock signal between the PLL 210 and the third set of core logic 216.

Figure 3:
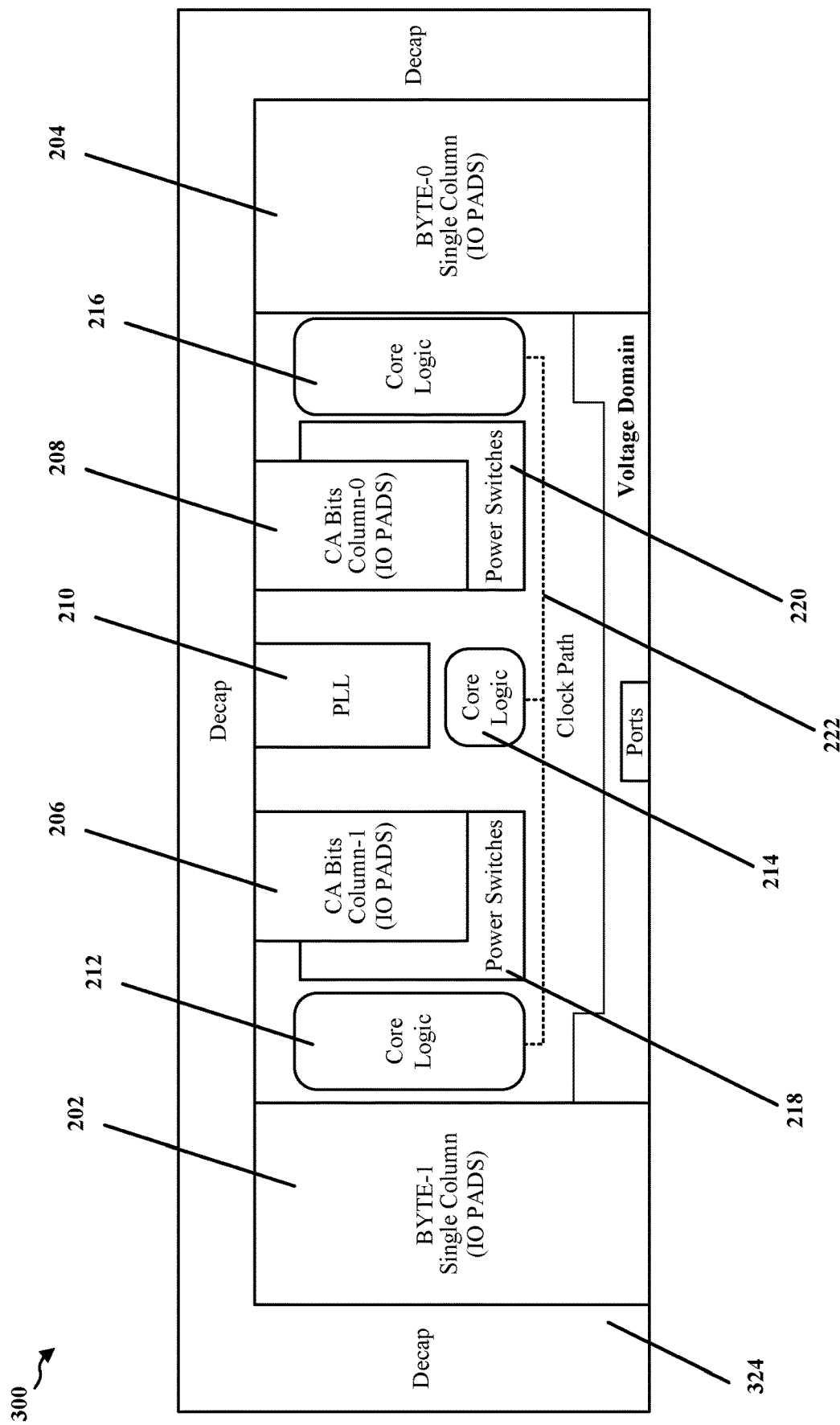
FIG. 3 is a diagram illustrating a second configuration of a DDR PHY floorplan.

FIG. 3 is a diagram 300 illustrating a second configuration of a DDR PHY floorplan. As illustrated in FIG. 3, the DDR PHY further includes at least one bank of decoupling capacitors 324 adjacent one of the first data I/O block 202 or the first CA I/O subblock 206. In one configuration, the at least one bank of decoupling capacitors 324 is adjacent one of the first data I/O block 202, the first CA I/O subblock 206, the second CA I/O subblock 208, or the second data I/O block 204. In one configuration, the at least one bank of decoupling capacitors is adjacent each of the first data I/O block 202, the first CA I/O subblock 206, the second CA I/O subblock 208, and the second data I/O block 204.

Referring again to FIGS. 2, 3, the sets of power switches 218, 220 occupy all of the layers used for routing. By locating the sets of power switches 218, 220 immediately adjacent the CA I/O subblocks 206, 208, which themselves occupy all of the layers used for routing, overall routing limitations (global and inter routing across the DDR PHY, and intra-routing within the DDR PHY) may be reduced because the sets of power switches 218, 220 and CA I/O subblocks 206, 208, which are effectively a wall for routing, are located together. Further, locating the sets of power switches 218, 220 near the sets of core logic 212, 214, 216 reduces IR drop and improves the performance of the power distribution network (PDN). Locating the sets of power switches 218, 220 close to the sets of core logic 212, 214, 216 reduces a resistance from the output of the sets of power switches 218, 220 to the power/ground grid supplying power/ground to the sets of core logic 212, 214, 216, which in turn reduces power-supply drop. In addition, by utilizing single column data I/O blocks 202, 204 and locating the PLL 210 between the CA I/O subblocks 206, 208, a PLL clock route length may be reduced and made to be uniform, which reduces jitter, duty cycle distortion, and a clock insertion delay. Further, in the provided floorplan, voltage regions are clearly separated, which reduces the redistribution layer (RDL) (or highest layer PDN) complexity. Lastly, the provided floorplan provides a footprint area reduction of at least 13%. Further footprint area reductions can be achieved by removing some of the banks of decoupling capacitors 324.

The previous description is provided to enable any person skilled in the art to practice the various aspects described herein. Various modifications to these aspects will be readily apparent to those skilled in the art, and the generic principles defined herein may be applied to other aspects. Thus, the claims are not limited to the aspects described herein, but are to be accorded the full scope consistent with the language claims. Reference to an element in the singular does not mean "one and only one" unless specifically so stated, but rather "one or more." Terms such as "if," "when," and "while" do not imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. Sets should be interpreted as a set of elements where the elements number one or more. Accordingly, for a set of X, X would include one or more elements. If a first apparatus receives data from or transmits data to a second apparatus, the data may be received/transmitted directly between the first and second apparatuses, or indirectly between the first and second apparatuses through a set of apparatuses. All structural and functional equivalents to the elements of the various aspects described throughout this disclosure that are known or later come to be known to those of ordinary skill in the art are expressly incorporated herein by reference and are encompassed by the claims. Moreover, nothing disclosed herein is dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for." As used herein, the phrase "based on" shall not be construed as a reference to a closed set of information, one or more conditions, one or more factors, or the like. In other words, the phrase "based on A" (where "A" may be information, a condition, a factor, or the like) shall be construed as "based at least on A" unless specifically recited differently.

The following examples are illustrative only and may be combined with aspects of other implementations or teachings described herein, without limitation.

Aspect 1 is an IC comprising a first set of core logic configured to convert data between a single stream and a double stream; a first data I/O block on a first side of the first set of core logic, the first data I/O block interfacing with the first set of core logic, the first data I/O block including a plurality of I/O circuits for interfacing with a DRAM, the first data I/O block being in one column; a second set of core logic configured to process CA information; a first CA I/O subblock on a second side of the first set of core logic, the first CA I/O subblock interfacing with the second set of core logic, the first CA I/O subblock including a plurality of I/O circuits for interfacing with the DRAM; and a first set of power switches adjacent at least one side of the first CA I/O subblock, the first set of power switches being coupled to the first set of core logic and the second set of core logic.

Aspect 2 is the IC of aspect 1, wherein the first set of power switches is immediately adjacent the at least one side of the first CA I/O subblock.

Aspect 3 is the IC of any of aspects 1 and 2, wherein the first set of power switches is adjacent two sides of the first CA I/O subblock, and at least a portion of the first set of power switches is between the first CA I/O subblock and the first set of core logic.

Aspect 4 is the IC of any of aspects 1 to 3, further comprising: a third set of core logic configured to convert data between a single stream and a double stream; a second data I/O block on a first side of the third set of core logic, the second data I/O block interfacing with the third set of core logic, the second data I/O block including a plurality of I/O circuits for interfacing with the DRAM, the second data I/O block being in one column; a second CA I/O subblock on a second side of the third set of core logic, the second CA I/O subblock interfacing with the second set of core logic, the second CA I/O subblock including a plurality of I/O circuits for interfacing with the DRAM, the first CA I/O subblock and the second CA I/O subblock together being a folded double-column I/O block; and a second set of power switches adjacent at least one side of the second CA I/O subblock, the second set of power switches being coupled to the third set of core logic and the second set of core logic.

Aspect 5 is the IC of aspect 4, wherein the second set of power switches is immediately adjacent the at least one side of the second CA I/O subblock.

Aspect 6 is the IC of any of aspects 4 and 5, wherein the second set of power switches is adjacent two sides of the second CA I/O subblock, and at least a portion of the second set of power switches is between the second CA I/O subblock and the third set of core logic.

Aspect 7 is the IC of any of aspects 4 to 6, further comprising a PLL on a first side of the second set of core logic and between the first CA I/O subblock and the second CA I/O subblock, the PLL being configured to provide a clock signal to the first set of core logic, the second set of core logic, and the third set of core logic.

Aspect 8 is the IC of aspect 7, wherein a clock path length for carrying the clock signal between the PLL and the first set of core logic is approximately equal to a clock path length for carrying the clock signal between the PLL and the third set of core logic.

Aspect 9 is the IC of any of aspects 4 to 8, further comprising at least one bank of decoupling capacitors adjacent one of the first data I/O block, the first CA I/O subblock, the second CA I/O subblock, or the second data I/O block.

Aspect 10 is the IC of aspect 9, wherein the at least one bank of decoupling capacitors is adjacent each of the first data I/O block, the first CA I/O subblock, the second CA I/O subblock, and the second data I/O block.

Aspect 11 is the IC of any of aspects 1 to 10, further comprising at least one bank of decoupling capacitors adjacent one of the first data I/O block or the first CA I/O subblock.

Aspect 12 is the IC of any of aspects 1 to 11, wherein the IC is a DDR PHY block.

What is claimed is:

1. An integrated circuit (IC), comprising:
    a first set of core logic configured to convert data between a single stream and a double stream;
    a first data input or output (I/O) block on a first side of the first set of core logic, the first data I/O block interfacing with the first set of core logic, the first data I/O block including a plurality of I/O circuits for interfacing with a dynamic random-access memory (DRAM), the first data I/O block being in one column;
    a second set of core logic configured to process command and address (CA) information;
    a first CA I/O subblock on a second side of the first set of core logic, the first CA I/O subblock interfacing with the second set of core logic, the first CA I/O subblock including a plurality of I/O circuits for interfacing with the DRAM; and
    a first set of power switches adjacent at least one side of the first CA I/O subblock, the first set of power switches being coupled to the first set of core logic and the second set of core logic.

2. The IC of claim 1, wherein the first set of power switches is immediately adjacent the at least one side of the first CA I/O subblock.

3. The IC of claim 1, wherein the first set of power switches is adjacent two sides of the first CA I/O subblock, and at least a portion of the first set of power switches is between the first CA I/O subblock and the first set of core logic.

4. The IC of claim 1, further comprising:
    a third set of core logic configured to convert data between a single stream and a double stream;
    a second data I/O block on a first side of the third set of core logic, the second data I/O block interfacing with the third set of core logic, the second data I/O block including a plurality of I/O circuits for interfacing with the DRAM, the second data I/O block being in one column;
    a second CA I/O subblock on a second side of the third set of core logic, the second CA I/O subblock interfacing with the second set of core logic, the second CA I/O subblock including a plurality of I/O circuits for interfacing with the DRAM, the first CA I/O subblock and the second CA I/O subblock together being a folded double-column I/O block; and
    a second set of power switches adjacent at least one side of the second CA I/O subblock, the second set of power switches being coupled to the third set of core logic and the second set of core logic.

5. The IC of claim 4, wherein the second set of power switches is immediately adjacent the at least one side of the second CA I/O subblock.

6. The IC of claim 4, wherein the second set of power switches is adjacent two sides of the second CA I/O subblock, and at least a portion of the second set of power switches is between the second CA I/O subblock and the third set of core logic.

7. The IC of claim 4, further comprising a phase-locked loop (PLL) on a first side of the second set of core logic and between the first CA I/O subblock and the second CA I/O subblock, the PLL being configured to provide a clock signal to the first set of core logic, the second set of core logic, and the third set of core logic.

8. The IC of claim 7, wherein a clock path length for carrying the clock signal between the PLL and the first set of core logic is approximately equal to a clock path length for carrying the clock signal between the PLL and the third set of core logic.

9. The IC of claim 4, further comprising at least one bank of decoupling capacitors adjacent one of the first data I/O block, the first CA I/O subblock, the second CA I/O subblock, or the second data I/O block.

10. The IC of claim 9, wherein the at least one bank of decoupling capacitors is adjacent each of the first data I/O block, the first CA I/O subblock, the second CA I/O subblock, and the second data I/O block.

11. The IC of claim 1, further comprising at least one bank of decoupling capacitors adjacent one of the first data I/O block or the first CA I/O subblock.

12. The IC of claim 1, wherein the IC is a double data rate (DDR) physical (PHY) block.

* * * * *